United States Patent [19]
Harima et al.

[11] Patent Number: 6,060,946
[45] Date of Patent: May 9, 2000

[54] SEMICONDUCTOR DEVICE HAVING IMPROVED IMMUNITY TO POWER SUPPLY VOLTAGE FLUCTUATIONS

[75] Inventors: Takayuki Harima, Kawaguchi; Kenichi Nakamura, Sumida-ku; Masami Masuda, Yokohama, all of Japan

[73] Assignee: Kabushiki Kaisha Toshiba, Kanagawa-ken, Japan

[21] Appl. No.: 09/025,662

[22] Filed: Feb. 18, 1998

[30] Foreign Application Priority Data

Feb. 18, 1997 [JP] Japan .................................. 9-033971
Feb. 3, 1998 [JP] Japan .................................. 9-022064

[51] Int. Cl.$^7$ ................................................. H03K 5/00
[52] U.S. Cl. ........................... 327/551; 327/311; 361/17
[58] Field of Search .................................. 327/535, 551, 327/333, 310, 311; 361/17, 18

[56] References Cited

U.S. PATENT DOCUMENTS

| | | | |
|---|---|---|---|
| 5,399,920 | 3/1995 | Tran | 326/83 |
| 5,659,258 | 8/1997 | Tanabe et al. | 326/68 |
| 5,731,694 | 3/1998 | Wilcox et al. | 323/287 |
| 5,736,869 | 4/1998 | Wei | 326/81 |

FOREIGN PATENT DOCUMENTS 362029315 of 1987 Japan ................................ 327/333

*Primary Examiner*—Terry D. Cunningham
*Attorney, Agent, or Firm*—Loeb & Loeb, LLP

[57] ABSTRACT

An input buffer circuit is connected to a first power supply voltage pad for applying a first power supply voltage, and a first ground line. An internal circuit larger in power consumption than the input buffer circuit is connected to a second power supply voltage pad for applying a second power supply voltage, and a second ground line. The parasitic resistance of the first ground line is higher than that of the second ground line. By connecting a capacitance between a power supply line connected to the first power supply voltage pad, and the first ground line, fluctuations in first power supply voltage are suppressed to prevent the input buffer circuit from malfunctioning.

11 Claims, 10 Drawing Sheets

SEMICONDUCTOR DEVICE HAVING IMPROVED IMMUNITY TO POWER SUPPLY VOLTAGE FLUCTUATIONS

BACKGROUND OF THE INVENTION

The present invention relates to a semiconductor device and, more particularly, to a device which receives a plurality of power supply voltages.

Semiconductor devices include one in which the power supply of an input interface circuit is suppressed in order to suppress the power consumption of an MPU (Micro Processor Unit), a CPU (Central Processor Unit), or another logic circuit connected to this semiconductor device. This semiconductor device comprises an internal circuit which operates by an internal signal having a voltage swing width different from that of an input signal. In this device, the first power supply voltage having the same level as that of the input signal, and the second power supply voltage having the same level as that of the internal signal are respectively applied for an input circuit for receiving the input signal, and the internal circuit for performing processing upon reception of an output from the input circuit. FIG. 11 shows the arrangement of a semiconductor device 10 associated with the present invention.

The semiconductor device 10 comprises an input buffer circuit 21, an internal circuit 22, an output buffer circuit 23, and a substrate bias generator 33. The semiconductor device 10 further comprises an input pad 31, power supply lines 32, 34, and 36, ground pads 35 and 37, an output pad 38, and a substrate bias voltage line 71. A power supply voltage $V_{DDI}$ equal to the voltage of an input signal is applied to the power supply line 32, a substrate bias voltage $V_{BB}$ is applied to the substrate bias voltage line 71, a power supply voltage $V_{DD}$ equal to the voltage of an internal signal is applied to the power supply line 34, and a power supply voltage $V_{DDQ}$ equal to the voltage of a signal to be externally output is applied to the power supply line 36. The power supply voltages $V_{DDI}$ and $V_{DDQ}$ are as low as, e.g., 1.8 V or 2.5 V. The power supply voltage $V_{DD}$ is higher, e.g., 3.3 V or 5 V. Both the power supply voltages $V_{DDQ}$ and $V_{DDI}$ are for interfaces and generally at the same level.

The semiconductor device 10 has the ground pads 35 and 37. A ground terminal 42 of the internal circuit 22 larger in charge/discharge current than the input buffer circuit 21 is connected to the ground pad 35 via a ground line 52 having a large line width. A ground terminal 41 of the input buffer circuit 21 is connected to the ground pad 35 via a ground line 51 having a small line width and a parasitic resistance R higher than the resistance of the ground line 52. The voltage of the ground line 51 is a ground voltage $V_{SSI}$. A ground terminal 43 of the output buffer circuit 23 is connected to the ground pad 37 via a ground line 53 having a large line width.

The input buffer circuit 21 is equivalent to the first stage of the input portion of the semiconductor device 10, and receives an input signal externally input via the input pad 31. The power supply voltage $V_{DDI}$ is applied to the input buffer circuit 21 via the power supply line 32.

The internal circuit 22 receives the input signal output from the input buffer circuit 21. The power supply voltage $V_{DD}$ is applied to the internal circuit 22 via the power supply line 34. The internal circuit 22 amplifies and converts the input signal swinging within the range of the power supply voltage $V_{DDI}$ to a ground voltage $V_{SS}$ into an internal signal swinging within the range of the power supply voltage $V_{DD}$ to the ground voltage $V_{SS}$, and then performs necessary processing. The internal circuit 22 outputs the internal signal swinging within the range of the power supply voltage $V_{DD}$ to the ground voltage $V_{SS}$. When the semiconductor device 10 is, e.g., a semiconductor memory device, the internal circuit 22 comprises a memory array, a decoder, a sense amplifier, and various control circuits.

The power supply voltage $V_{DDQ}$ is applied to the output buffer circuit 23 via the power supply line 36. The output buffer circuit 23 receives the internal signal output from the internal circuit 22 to output a signal swinging within the range of the power supply voltage $V_{DDQ}$ to the ground voltage $V_{SS}$. This signal is output outside the device 10 via the output pad 38. Of the circuits 21 to 23, the power consumption of the internal circuit 22 is large. A power supply line 62 connected to the power supply line 34, and the ground line 52 connected to the ground pad 35 have large widths. The power consumption of the output buffer circuit 23 is also large. Similarly, a power supply line 63 connected to the power supply line 36, and the ground line 53 connected to the ground pad 37 have large widths. The power consumption of the input buffer circuit 21 is the smallest. A power supply line 61 connected to the power supply line 32, and the ground line 51 connected to the ground pad 35 have small widths.

A small line capacitance of power supply lines leads to a small effect of stabilizing the power supply voltage. If a power supply voltage having fluctuations is applied from a power supply outside the device 10, the fluctuations cannot be satisfactorily suppressed. Therefore, upon application of the power supply voltage having fluctuations, the device 10 may malfunction.

Particularly, the power supply line 61 connected to a circuit like the input buffer circuit 21 which is often formed in a well independently of the remaining circuits 22 and 23 is much smaller in capacitance than the power supply lines 62 and 63. Since the input buffer circuit 21 is located on the first stage where an input signal is externally input, a malfunction of the circuit 21 influences all subsequent processes. For this reason, the input buffer circuit 21 must be particularly prevented from malfunctioning.

FIG. 12 shows the arrangement of another semiconductor device associated with the present invention. In this device, to prevent an input buffer circuit 21 from malfunctioning, a capacitance in addition to a parasitic capacitance is formed on a power supply line 32 for supplying the power supply voltage $V_{DDI}$ to the circuit 21. In many cases, a parasitic capacitance exists between the power supply line 32, and another power supply line 34 or 36 or a ground pad 35 or 37. However, only this parasitic capacitance cannot satisfactorily suppress fluctuations in power supply voltage, so a capacitance C0 is connected between the power supply line 32 and the ground pad 35.

A ground line 52 having a large line width and a low parasitic resistance is connected between the ground pad 35 and an internal circuit 22. The power consumption of the internal circuit 22 is large, and the ground voltage $V_{SS}$ varies in turning on/off a transistor constituting the internal circuit 22. The variations in ground voltage $V_{SS}$ are transmitted to the power supply line 32 via the ground line 52, the ground pad 35, and the capacitance C0. That is, although the capacitance of the power supply line 32 can be increased to suppress fluctuations in power supply voltage by arranging the capacitance C0, variations in power supply of the internal circuit 22 connected to the capacitance C0 are transmitted to cause a malfunction of the input buffer circuit 21.

FIGS. 13A and 13B respectively show variations in power supply voltage $V_{DD}$ and ground voltage $V_{SS}$. Assume that the power supply voltage $V_{DD}$ applied to the power supply line 34 varies to the negative side, and the ground voltage $V_{SS}$ to the ground pad 35 varies to the positive side, as shown in FIG. 13A. The variations in ground voltage $V_{SS}$ in the ground pad 35 are transmitted to the power supply line 32 via the capacitance C0. At this time, the power supply voltage $V_{DDI}$ varies to the positive side by level L1, as shown in FIG. 13B. As a result, when a high-level (H) input signal is input, as shown in FIG. 13B, the input buffer circuit 21 may malfunction. That is, if the power supply voltage $V_{DDI}$ varies to the positive side by level L1, the circuit threshold Vth of the input buffer circuit 21 increases by Vth+L1. Accordingly, even when an input signal of a level higher than the original threshold Vth is input, if the level of the input signal is lower than the circuit threshold Vth+L1, the circuit recognizes the input signal to be at low level.

SUMMARY OF THE INVENTION

It is, therefore, an object of the present invention to provide a semiconductor device in which a circuit can be prevented from malfunctioning due to fluctuations in power supply voltage.

According to the present invention, there is provided a semiconductor device comprising, an input circuit which is applied with a first power supply voltage via a first power supply line, and externally receives an input signal to output an internal signal, an internal circuit which is applied with a second power supply voltage via a second power supply line, grounded by a first ground line, and receives the internal signal to perform predetermined processing, and a capacitance having two terminals connected between a second ground line smaller in power supply variation than the first ground line, and the first power supply line.

The second ground line may be used to ground a circuit smaller in charge/discharge current than the internal circuit.

The second ground line is desirably higher in parasitic resistance than the first ground line.

According to the present invention, there is provided a semiconductor device comprising an input circuit which is applied with a first power supply voltage via a first power supply line, grounded by a first ground line, and externally receives an input signal to output an internal signal, an internal circuit which is applied with a second power supply voltage via a second power supply line, grounded by a second ground line, receives the internal signal to perform predetermined processing, and is larger in charge/discharge current than the input circuit, and a capacitance having two terminals connected between the first power supply line and the first ground line.

The first ground line is desirably higher in parasitic resistance than the second ground line.

According to the present invention, there is provided a semiconductor device comprising an input circuit which is applied with a first power supply voltage via a first power supply line, grounded by a first ground line, and externally receives an input signal to output an internal signal, an internal circuit which is applied with a second power supply voltage via a second power supply line, grounded by a second ground line, receives the internal signal to perform predetermined processing, and is larger in charge/discharge current than the input circuit, a substrate bias generator for generating a substrate bias voltage, and applying the substrate bias voltage to a semiconductor substrate via a substrate bias voltage line connected to the semiconductor substrate on which at least either one of the input circuit and the internal circuit is formed, a first capacitance having two terminals connected between the first power supply line and the first ground line, a second capacitance having two terminals connected between the first power supply line and the second power supply line, and a third capacitance having two terminals connected between the first power supply line and the substrate bias voltage line.

Capacitance values of the first to third capacitances may be set equal to each other.

According to the present invention, there is provided a semiconductor device comprising an input circuit which is applied with a first power supply voltage via a first power supply line, grounded by a first ground line, and externally receives an input signal to output an internal signal, an internal circuit which is applied with a second power supply voltage via a second power supply line, grounded by a second ground line, receives the internal signal to perform predetermined processing, and is larger in charge/discharge current than the input circuit, a first substrate bias generator for generating a first substrate bias voltage, and applying the first substrate bias voltage to a first well of a first conductivity type via a first substrate bias voltage line connected to the first well on which at least either one of the input circuit and the internal circuit is formed, a second substrate bias generator for generating a second substrate bias voltage, and applying the second substrate bias voltage to a second well of a second conductivity type via a second substrate bias voltage line connected to the second well on which at least either one of the input circuit and the internal circuit is formed, a first capacitance having two terminals connected between the first power supply line and the first ground line, a second capacitance having two terminals connected between the first power supply line and the second power supply line, a third capacitance having two terminals connected between the first power supply line and the first substrate bias voltage line, and a fourth capacitance having two terminals connected between the first power supply line and the second substrate bias voltage line.

Capacitance values of the first to fourth capacitances may be set equal to each other.

The first power supply line may be connected to a first power supply pad, the second power supply line may be connected to a second power supply pad, and the first and second ground lines may be connected to a ground pad.

The first power supply line may be connected to a first power supply pad, the second power supply line may be connected to a second power supply pad, the first ground line may be connected to a first ground pad, the second ground line may be connected to a second ground pad, and the first and second ground pads may be connected via a line higher in parasitic resistance than the first ground line.

The capacitance may be formed as either one of a junction capacitance having an n-type impurity region and a p-type impurity region formed in a surface portion of a semiconductor substrate, and an electrode capacitance having an n- or p-type impurity region formed in a surface portion of a semiconductor substrate, and an electrode formed on the impurity region via an insulating film.

According to the present invention, in the device which receives a plurality of power supply voltages, the capacitance is connected between the power supply line connected to the input circuit, and another pad or line having small power supply variations. The capacitance increases to suppress fluctuations in power supply, and a malfunction caused by variations at a connection destination of the capacitance is prevented, resulting in high reliability.

BRIEF DESCRIPTION OF THE DRAWINGS

In the accompanying drawings.

DESCRIPTION OF THE PREFERRED EMBODIMENTS

An embodiment of the present invention will be described below with reference to the accompanying drawings.

Figure 1:
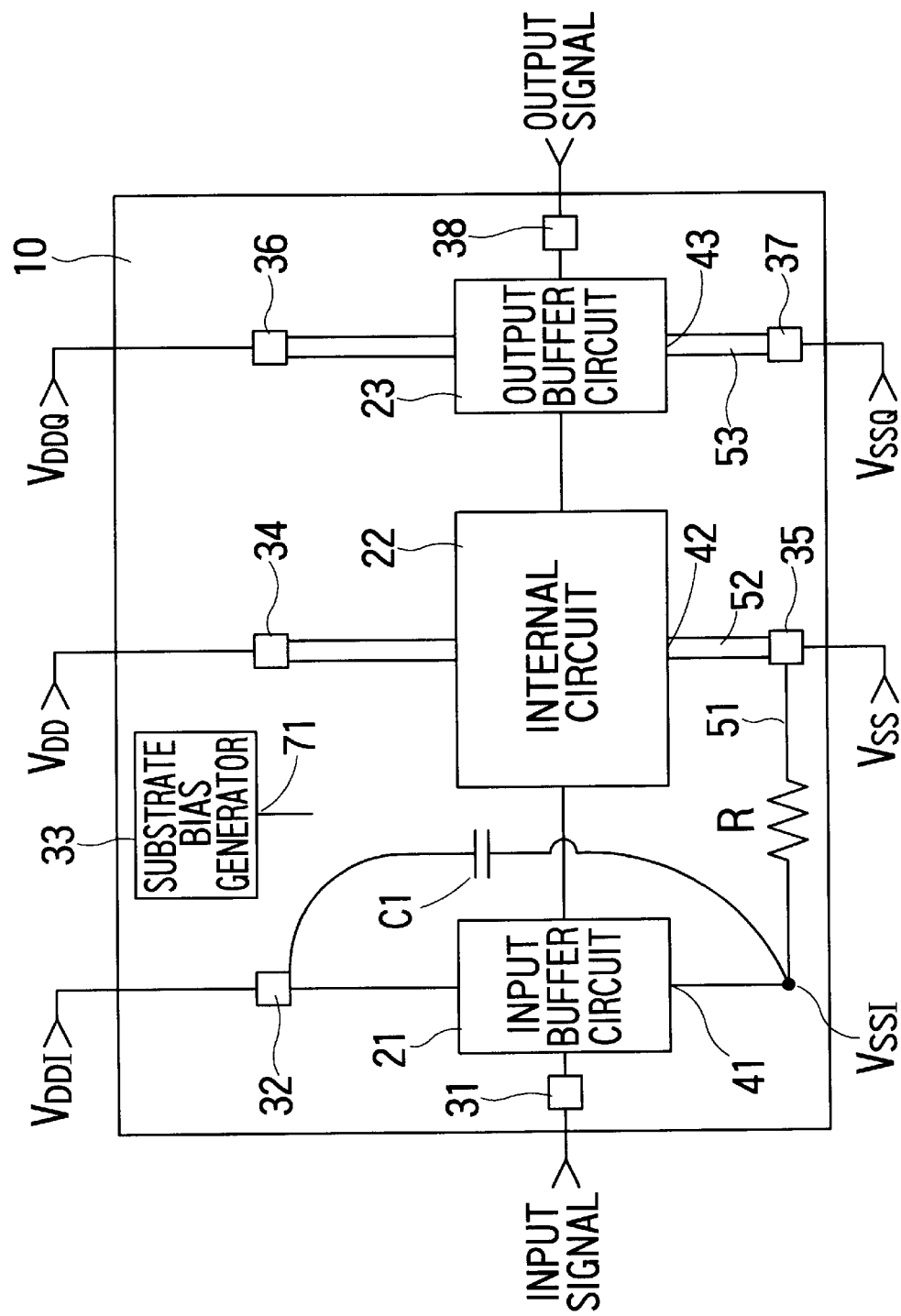
FIG. 1 is a circuit diagram showing the arrangement of a semiconductor device according to the first embodiment of the present invention.
Figure 11:
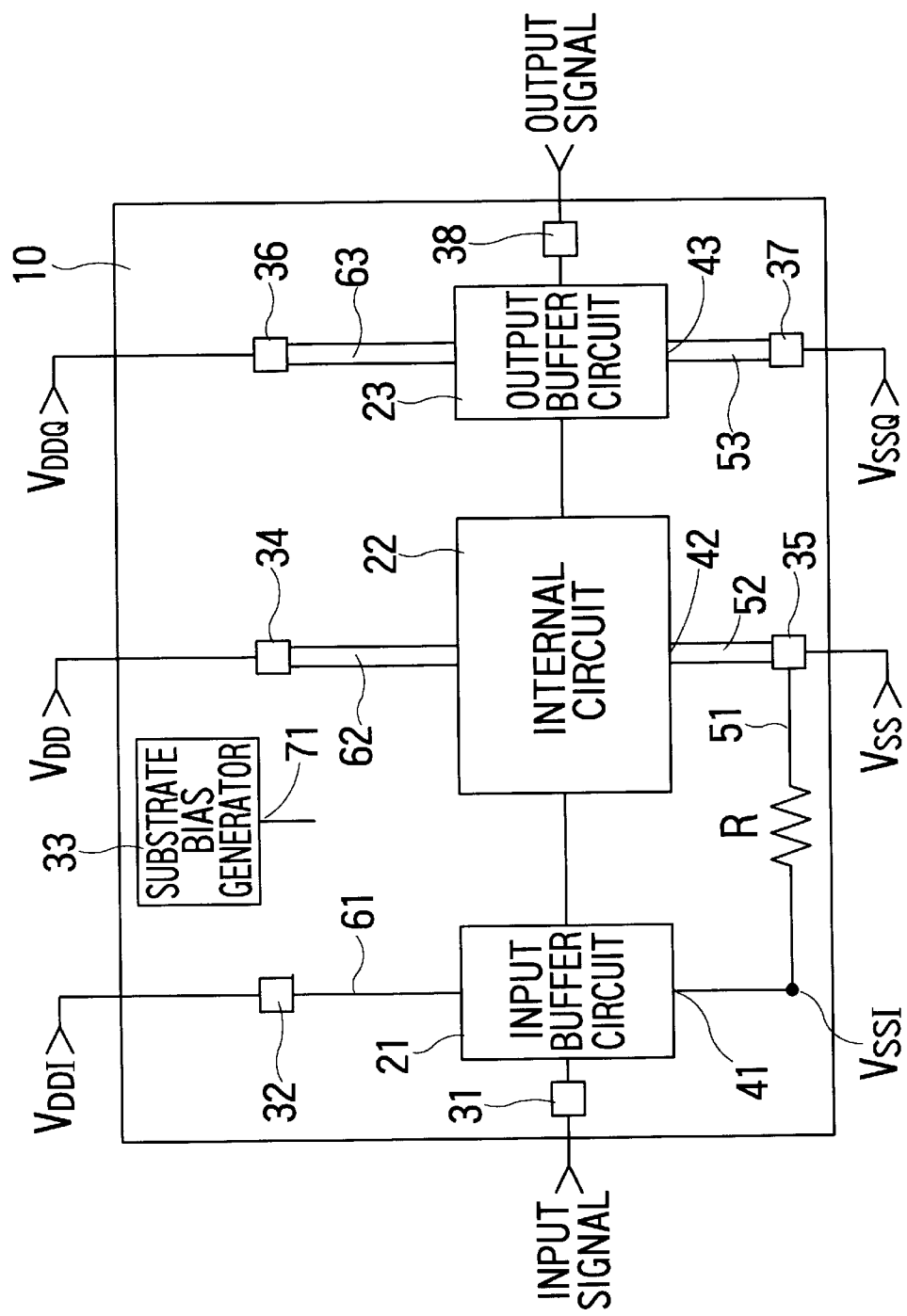
FIG. 11 is a circuit diagram showing the arrangement of a semiconductor device associated with the present invention.

FIG. 1 shows the arrangement of a semiconductor device according to the first embodiment of the present invention. The first embodiment is characterized in that, to prevent an input buffer circuit 21 from malfunctioning due to fluctuations in power supply voltage $V_{DDI}$, a capacitance is connected between a power supply line 32 or power supply line connected to the power supply line 32, and another pad or line having small fluctuations in voltage. More specifically, a capacitance C1 is connected between a ground line 51 which connects a ground terminal 41 of the input buffer circuit 21 to a ground pad 35 and has a level of the voltage $V_{SSI}$, and the power supply line 32 or power supply line connected to the power supply line 32. The same reference numerals of the device shown in FIG. 11 denote the same parts, and a description thereof will be omitted.

Figure 12:
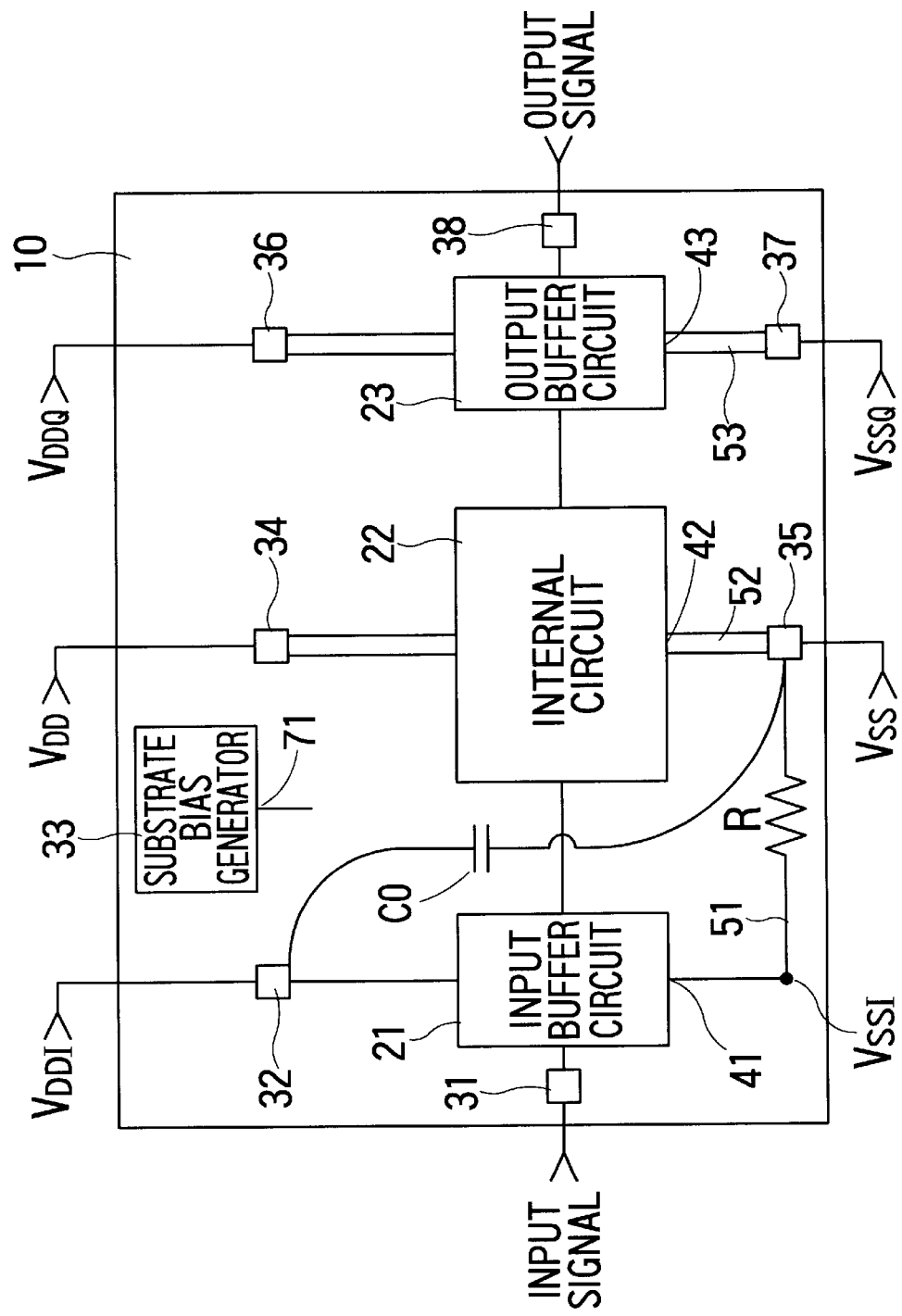
FIG. 12 is a circuit diagram showing the arrangement of another semiconductor device associated with the present invention.

In the device shown in FIG. 12, the capacitance C0 is connected between the power supply line 32 and the ground voltage pad 35, as described above. This arrangement increases the capacitance for the power supply voltage $V_{DDI}$ to suppress fluctuations in voltage $V_{DDI}$. However, since the voltage of the ground pad 35 connected to the capacitance C0 varies under the influence of variations in power supply of the internal circuit 22 having large power consumption, the variations are transmitted to the power supply line 32 via the capacitance C0 to cause a malfunction of the input buffer circuit 21.

To the contrary, in this embodiment, the ground line 51 of the input buffer circuit 21 is selected as the connection destination of the capacitance of the power supply line 32 or power supply line connected to the power supply line 32. The ground line 51 is a thin line having a parasitic resistance R. For this reason, even if the power supply of an internal circuit 22 having large power consumption varies to vary the ground voltage $V_{SS}$ of the ground pad 35, the voltage $V_{SSI}$ of the ground line 51 remains at a level at which the variations are suppressed. While the influence of variations in power supply of the internal circuit 22 is suppressed, the capacitance of the power supply line 32 can be increased. Fluctuations in power supply voltage $V_{DDI}$ are suppressed to prevent a malfunction of the input buffer circuit 21.

Figure 13A:
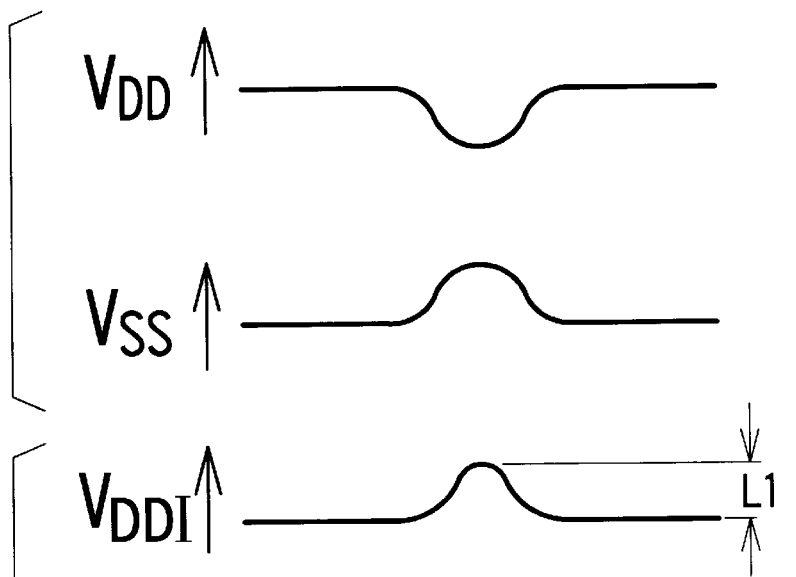
FIGS. 13A to 13C are explanatory views, respectively, showing power supply variations in the semiconductor device associated with the present invention and the semiconductor device according to the first embodiment.
Figure 13B:
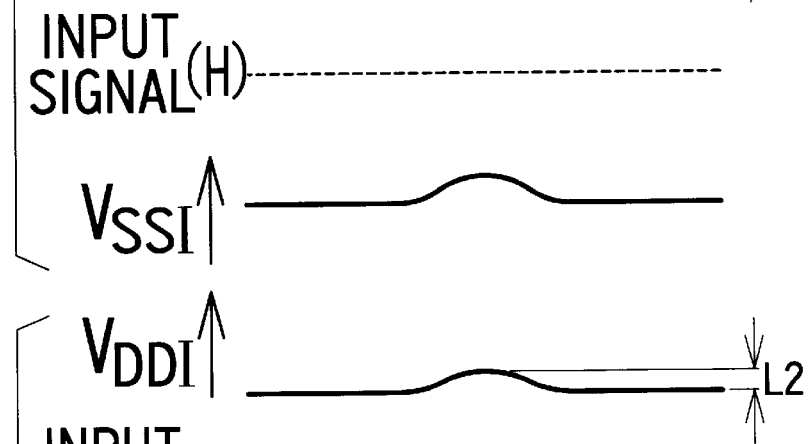
Figure 13C:
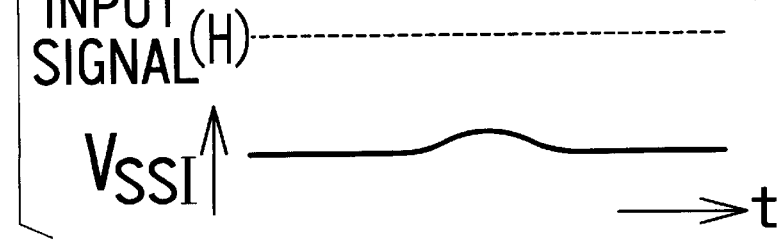

Even when the power supply voltage $V_{DD}$ of the power supply line 34 and the ground voltage $V_{SS}$ of the ground pad 35 vary, as shown in FIG. 13A, variations in power supply voltage $V_{DDI}$ of the power supply line 32 or power supply line connected to the power supply line 32 are suppressed. The power supply voltage $V_{DDI}$ varies by level L1 in the semiconductor device of FIG. 12, whereas it varies by only level L2 lower than level L1 in this embodiment. Therefore, the circuit threshold Vth increases by only Vth+L2. When an input signal of level higher than Vth+L2 is input, the input buffer circuit 21 can recognize the input signal to be at high level without inverting the logical level.

Figure 2:
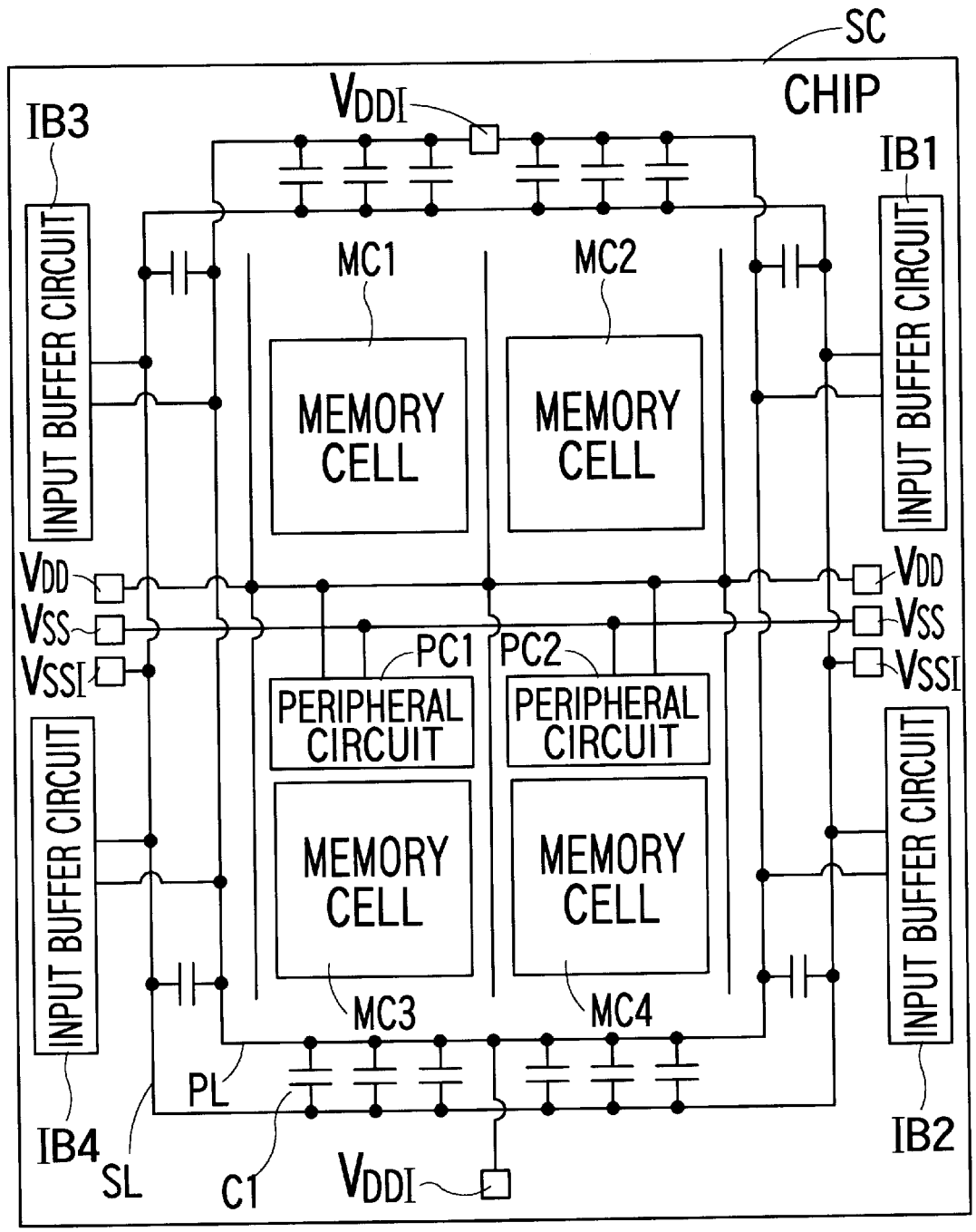
FIG. 2 is a view showing an example of the layout of the semiconductor device on a semiconductor chip.

FIG. 2 shows an example of the layout of semiconductor devices according to the first embodiments on a semiconductor chip SC. As an example of the internal circuit 22, memory cells MC1 to MC4 are laid out in four regions. Peripheral circuits PC1 and PC2 and input buffer circuits IB1 to IB4 are laid out around the memory cells MC1 to MC4. The power supply voltage $V_{DD}$ for driving the memory cells MC1 to MC4 is externally applied to power supply lines $V_{DD}$, and ground pads $V_{SS}$ are grounded. Both the peripheral circuits PC1 and PC2 receive the power supply voltage $V_{DD}$ via the power supply lines $V_{DD}$, and are grounded via the ground pads $V_{SS}$.

Power supply lines $V_{DDI}$ which are different from the power supply lines $V_{DD}$ and receive the power supply voltage $V_{DDI}$, and ground pads $V_{DDI}$ arranged separately from the ground pads $V_{SS}$ are formed. The input buffer circuits IB1 to IB4 are connected to the power supply lines $V_{DDI}$ and the ground pads $V_{SSI}$. A plurality of capacitances C1 are connected between a power supply line PL connected to the power supply lines $V_{DDI}$ and a ground line SL connected to the ground pads $V_{SSI}$.

Figure 3:
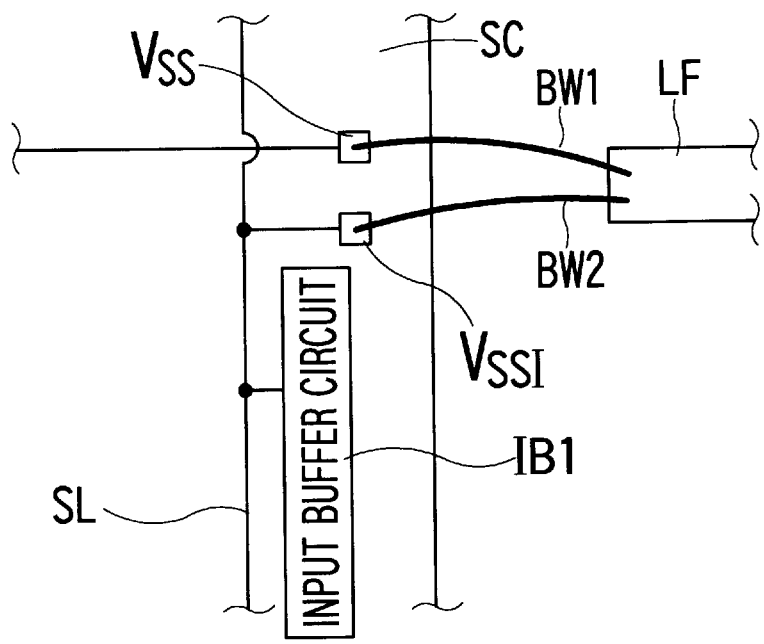
FIG. 3 is an explanatory view showing an example of the arrangement of grounding of a ground pad in the semiconductor device.

Several arrangements about grounding of the ground pads $V_{SS}$ and $V_{SSI}$ are conceivable. For example, as shown in FIG. 3, the ground pads $V_{SS}$ and $V_{SSI}$ may be grounded by double-bonding them to a common lead frame LF using wire BW1 and BW2. In this case, the ground pad $V_{SSI}$ is connected via the bonding wires BW1 and BW2 to the ground pad $V_{SS}$ having large voltage variations. The parasitic resistances of the wires BW1 and BW2 are relatively high, and parasitic resistances exist at the bonding portions. Therefore, variations in voltage of the ground pad $V_{SS}$ are relaxed before being transmitted to the ground pad $V_{SS}$.

Figure 4:
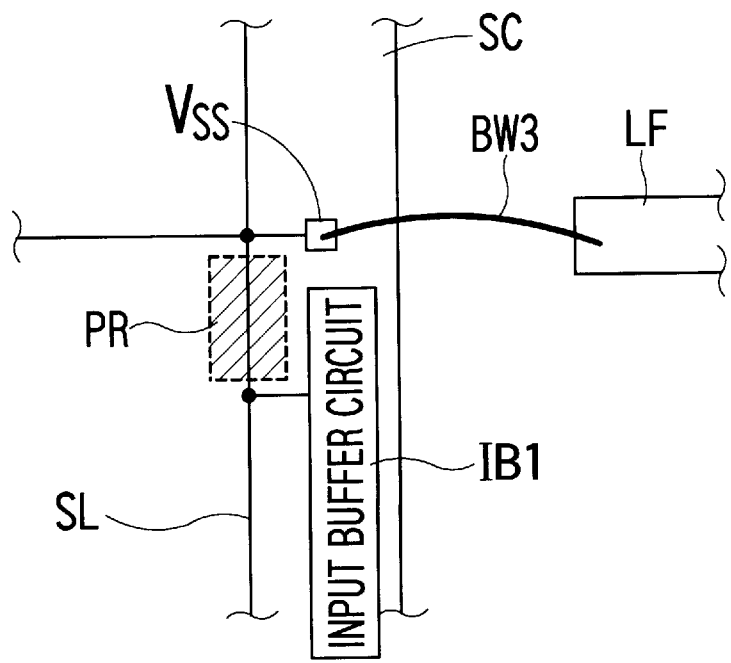
FIG. 4 is an explanatory view showing another example of the arrangement of grounding of the ground pad in the semiconductor device.

In the arrangement shown in FIG. 2 or 3, the ground line SL connected to the input buffer circuits IB1 to IB4 is connected to the ground pads $V_{SSI}$ different from the ground pads $V_{SS}$. As shown in FIG. 4, however, the ground line SL may be connected to the ground pads $V_{SS}$ without arranging any ground pad $V_{SSI}$. The ground line SL is formed using a material with a relatively low sheet resistance such as silicon.aluminum (Al.Si) or silicon.copper.aluminum (Al.Si.Cu). By setting the width of the ground line SL small (or prolonging the ground line SL), the line resistance can be increased to prevent variations in voltage of the ground pads $V_{SS}$ from being transmitted to the input buffer circuits IB1 to IB4.

Figure 5:
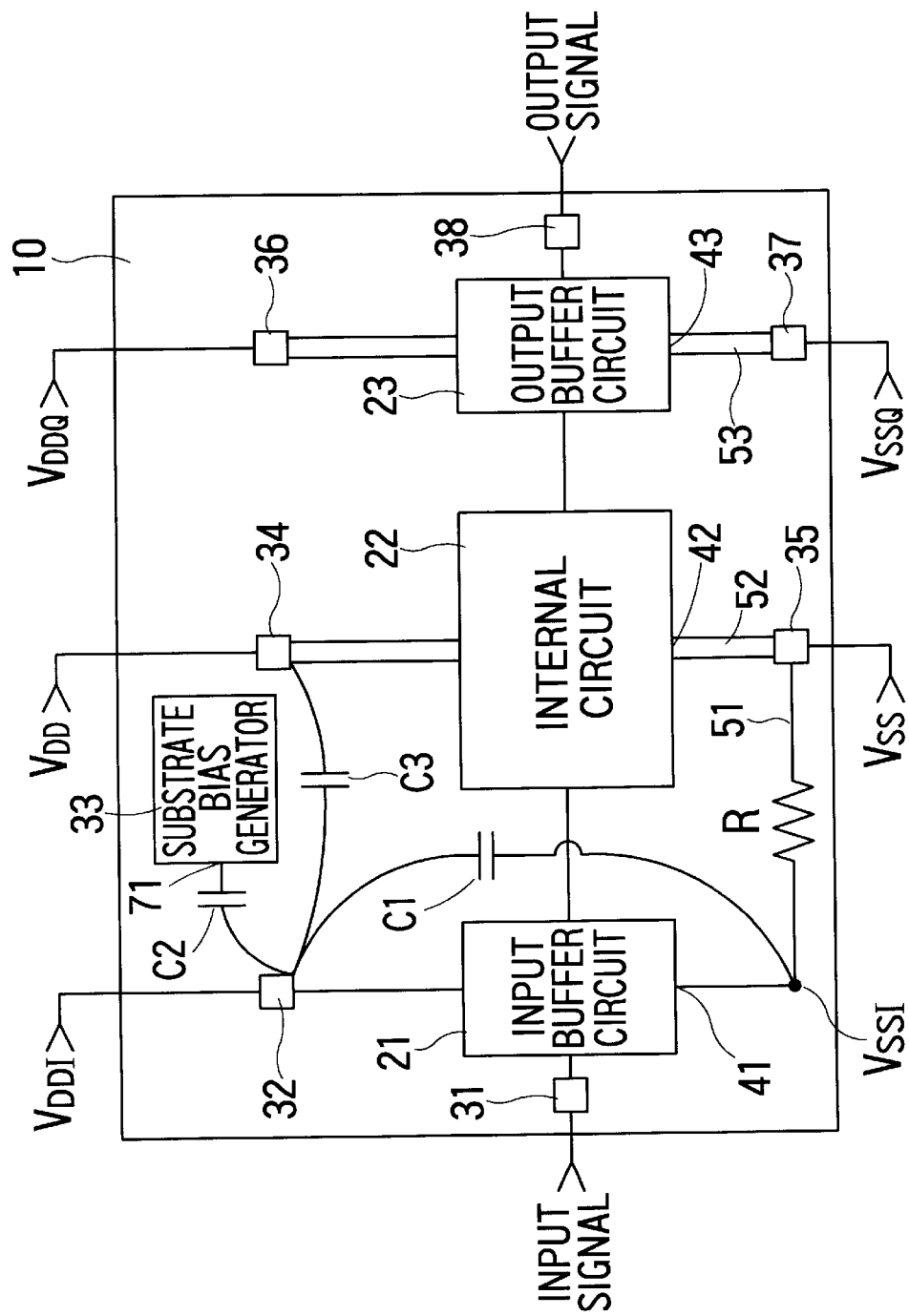
FIG. 5 is a circuit diagram showing the arrangement of a semiconductor device according to the second embodiment of the present invention.

A semiconductor device according to the second embodiment of the present invention will be described with reference to FIG. 5. The second embodiment is characterized in that a pad or line having small power supply variations is selected as the connection destination of a capacitance connected to a power supply line 32, as in the first embodiment, and in that capacitances are also connected to another pad and a terminal to distribute the capacitances without depending on a specific power supply voltage or ground voltage.

More specifically, a capacitance C1 is connected between the power supply line 32 and a ground line 51, a capacitance C2 between the power supply line 32 and a substrate bias voltage line 71 of a substrate bias generator 33, and a capacitance C3 between the power supply line 32 and a power supply line 34. In this manner, by connecting the capacitances between the power supply line 32, and not only the ground line 51 but also the substrate bias voltage line 71 and the power supply line 34, the capacitances are also distributed to the power supply voltages $V_{BB}$ and $V_{DD}$ without depending on only the ground voltage $V_{SS}$, and fluctuations in power supply voltage $V_{DDI}$ can be further suppressed. When fluctuations cannot be completely eliminated via the parasitic resistance R, the power supply line 32 is connected via a capacitance to a portion almost free from fluctuations, thereby reducing the fluctuations. At the same time, the power supply line 32 is also connected via a capacitance to a portion having fluctuations with another phase, thereby canceling the fluctuations in power supply voltage $V_{DDI}$.

No capacitance is connected between the power supply line 32, and a power supply line 36 or ground pad 37 connected to an output buffer circuit 23. Since the driving load of the output buffer circuit 23 is large, power supply variations are large. If a capacitance is connected to the output buffer circuit 23, the variations are undesirably transmitted to the power supply line 32. For this reason, it is desirable not to select, as a connection destination, a pad or line connected to a circuit like the output buffer circuit having very large power supply variations.

Figure 6:
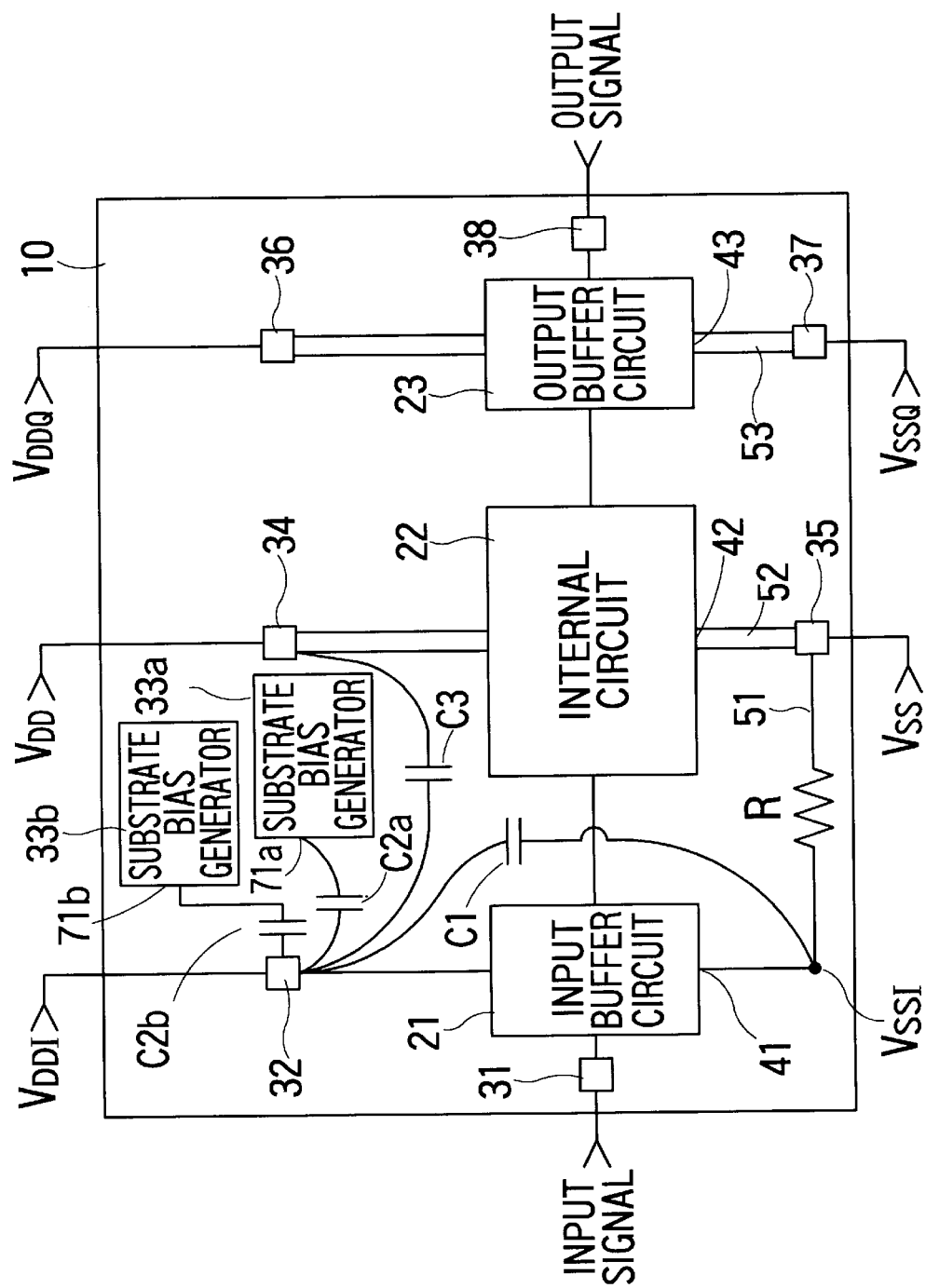
FIG. 6 is a circuit diagram showing the arrangement of a semiconductor device according to the third embodiment of the present invention.

A semiconductor device according to the third embodiment of the present invention has an arrangement shown in FIG. 6. The third embodiment is applied to a semiconductor device in which substrate bias generators 33a and 33b for generating two different substrate bias voltages $V_{BB1}$ and $V_{BB2}$ are arranged, and the substrate bias voltages $V_{BB1}$ and $V_{BB2}$ are applied to the semiconductor substrate via substrate bias voltage lines 71a and 71b. For example, the substrate bias voltage $V_{BB1}$ is applied to an n-type well formed in a surface portion of the semiconductor substrate, whereas the substrate bias voltage $V_{BB2}$ is applied to a p-type well. Similar to the second embodiment, a capacitance C1 is connected between a power supply line 32 and a ground line 51, and a capacitance C3 between the power supply line 32 and a power supply line 34. In addition, capacitances C2a and C2b are respectively connected between the power supply line 32 and the two substrate bias voltage lines 71a and 71b. In this way, by selecting four pads or lines as connection destinations, a larger number of capacitances can be distributed to suppress fluctuations in power supply voltage $V_{DDI}$.

Figure 7:
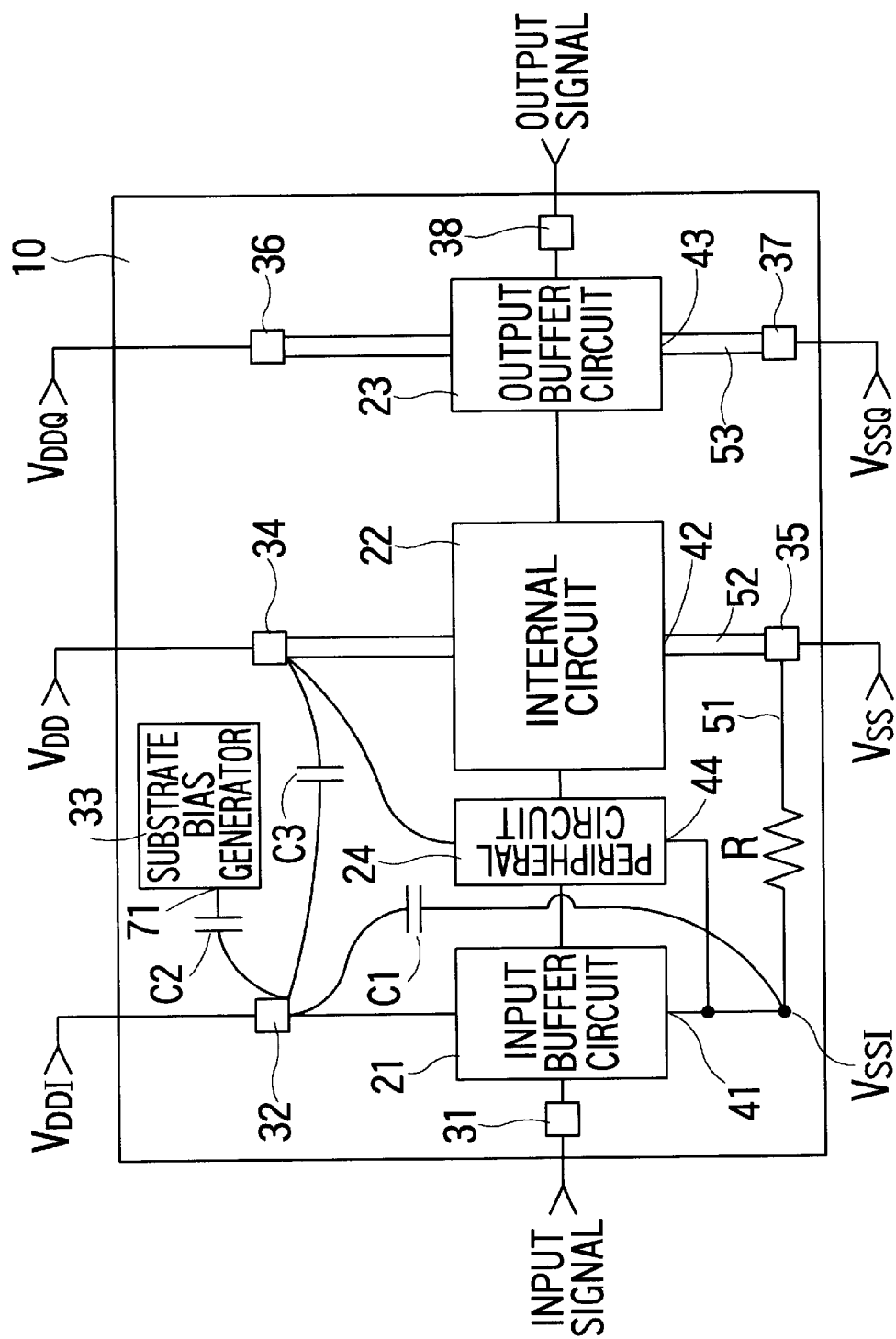
FIG. 7 is a circuit diagram showing the arrangement of a semiconductor device according to the fourth embodiment of the present invention.

A semiconductor device according to the fourth embodiment of the present invention will be described with reference to FIG. 7. This device comprises a peripheral circuit 24 such as a predecoder between an input buffer circuit 21 arranged on the first input stage, and an internal circuit 22. The peripheral circuit 24 is applied with the power supply voltage $V_{DD}$, receives an input signal output from the input buffer circuit 21, performs predetermined processing, and then outputs the signal to the internal circuit 22.

In the first embodiment, the ground line 51 of the input buffer circuit 21 is selected as a destination with small power supply variations to which the capacitance of the power supply line 32 is connected. In the fourth embodiment, a capacitance C1 is connected between a ground line 51 connected to a ground terminal 44 of the peripheral circuit 24, similar to a ground terminal 41 of the input buffer circuit 21, and a power supply line 32. Also in this case, a parasitic resistance R exists in the ground line 51, as in the first embodiment. Therefore, the influence of variations in power supply of the internal circuit 22 is relaxed without being directly transmitted to the ground line 51, and fluctuations in voltage $V_{DDI}$ of the power supply line 32 connected via the capacitance C1 are suppressed.

Figure 8:
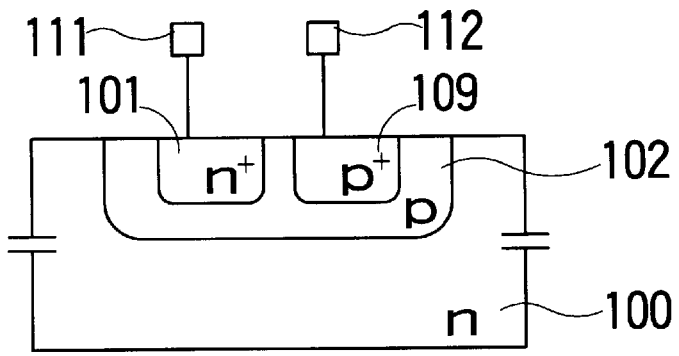
FIG. 8 is a longitudinal sectional view showing the structure of a junction capacitance usable as a capacitance in the first to fourth embodiments.
Figure 9:
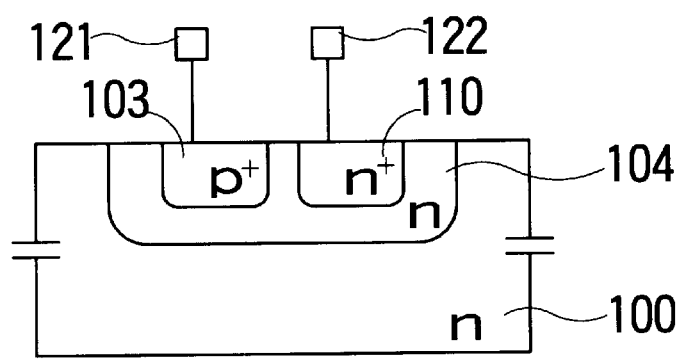
FIG. 9 is a longitudinal sectional view showing another structure of the junction capacitance useable as a capacitance in the first to fourth embodiments.

As the capacitance in the first to fourth embodiments, a junction capacitance like the one shown in FIG. 8 or 9 may be used. In the junction capacitance shown in FIG. 8, one terminal 112 of the junction capacitance is connected to a $p^+$-type impurity region 109 in a p-type well 102 formed in the surface of an n-type semiconductor substrate 100, and the other terminal 111 is connected to an $n^+$-type impurity region 101 formed in the p-type well 102. The junction capacitance shown in FIG. 9 has a conductivity type opposite to that of the junction capacitance shown in FIG. 8. One terminal 122 of the capacitance is connected to an $n^+$-type impurity region 110 in an n-type well 104 formed in the surface of an n-type semiconductor substrate 100, and the other terminal 121 is connected to a $p^+$-type impurity region 103 formed in the n-type well 104.

Figure 10:
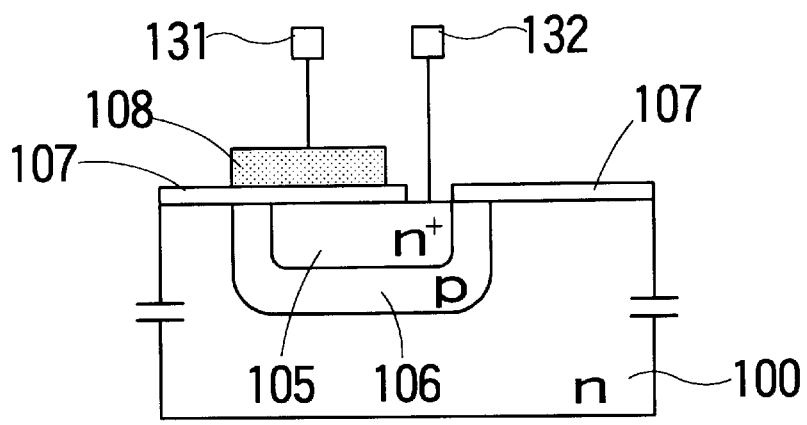
FIG. 10 is a longitudinal sectional view showing the structure of an electrode capacitance useable as a capacitance in the first to fourth embodiments.

Alternatively, an electrode capacitance like the one shown in FIG. 10 may be used. A p-type well 106 is formed in the surface of an n-type semiconductor substrate 100, and an $n^+$-type impurity region 105 is formed in the p-type well 106. An electrode 108 is formed on the $n^+$-type impurity region 105 via an insulating film 107. A terminal 132 is connected to the $n^+$-type impurity region 105; and a terminal 131, to the electrode 108. In this manner, the electrode capacitance may be formed between the electrode 108 connected to the terminal 131 and the $n^+$-type impurity region 105 connected to the terminal 132.

The above-described embodiments are merely examples, and do not limit the present invention. For example, the above embodiments are applied to a device having an input buffer circuit, an internal circuit, and an output buffer circuit. However, the present invention can be applied to a device as far as the device comprises at least an input circuit for receiving an input signal and an internal circuit for receiving an output from the input circuit, and different power supply voltages are applied to the two circuits. The present invention is applicable to a device having another circuit.

What is claimed is:

1. A semiconductor device comprising:
   an input circuit that receives a first power supply voltage via a first power supply line, and externally receives an input signal to output an internal signal;

an internal circuit that receives a second power supply voltage via a second power supply line, is grounded by a first ground line, and receives the internal signal to perform predetermined processing; and a capacitance having two terminals connected between a second ground line, grounding the input circuit, smaller in power supply variation than said first ground line and said first power supply line, wherein said input circuit is smaller in charge/discharge current than said internal circuit.

2. A semiconductor device comprising:

an input circuit that receives a first power supply voltage via a first power supply line, and externally receives an input signal to output an internal signal;

an internal circuit that receives a second power supply voltage via a second power supply line, is grounded by a first ground line, and receives the internal signal to perform predetermined processing; and a capacitance having two terminals connected between a second ground line, grounding a second circuit, smaller in power supply variation than said first ground line and said first power supply line, wherein said second ground line is higher in parasitic resistance than said first ground line.

3. A semiconductor device comprising:

an input circuit that receives a first power supply voltage via a first power supply line, and externally receives an input signal to output an internal signal;

an internal circuit that receives a second power supply voltage via a second power supply line, is grounded by a first ground line, and receives the internal signal to perform predetermined processing; and a capacitance having two terminals connected between a second ground line, grounding a second circuit, smaller in power supply variation than said first ground line and said first power supply line, wherein said first power supply line is connected to a first power supply pad, said second power supply line is connected to a second power supply pad, said first ground line is connected to a first ground pad, said second ground line is connected to a second ground pad, and said first and second ground pads are connected via a line higher in parasitic resistance than said first ground line.

4. A semiconductor device comprising:

an input circuit that receives a first power supply voltage via a first power supply line, and externally receives an input signal to output an internal signal;

an internal circuit that receives a second power supply voltage via a second power supply line, is grounded by a first ground line, and receives the internal signal to perform predetermined processing; and a capacitance having two terminals connected between a second ground line, grounding a second circuit, smaller in power supply variation than said first ground line and said first power supply line, wherein said capacitance is one of a junction capacitance having an n-type impurity region and a p-type impurity region formed in a surface portion of a semiconductor substrate, an electrode capacitance having an n- or p-type impurity region formed in a surface portion of a semiconductor substrate, and an electrode formed on the impurity region via an insulating film.

5. A semiconductor device comprising:

an input circuit supplied with a first power supply voltage via a first power supply line and grounded by a first ground line, which externally receives an input signal to output an internal signal;

an internal circuit supplied with a second power supply voltage via a second power supply line and grounded by a second ground line, which receives the internal signal to perform predetermined processing and is larger in charge/discharge current than said input circuit; and a capacitance having two terminals connected between said first power supply line and said first ground line, wherein said first ground line is higher in parasitic resistance than said second ground line.

6. A semiconductor device comprising:

an input circuit supplied with a first power supply voltage via a first power supply line and grounded by a first ground line, which externally receives an input signal to output an internal signal;

an internal circuit supplied with a second power supply voltage via a second power supply line and grounded by a second ground line, which receives the internal signal to perform predetermined processing and is larger in charge/discharge current than said input circuit; and a capacitance having two terminals connected between said first power supply line and said first ground line, wherein said first power supply line is connected to a first power supply pad, said second power supply line is connected to a second power supply pad, said first ground line is connected to a first ground pad, said second ground line is connected to a second ground pad, and said first and second ground pads are connected via a line higher in parasitic resistance than said first ground line.

7. A semiconductor device comprising:

an input circuit supplied with a first power supply voltage via a first power supply line and grounded by a first ground line, which externally receives an input signal to output an internal signal;

an internal circuit supplied with a second power supply voltage via a second power supply line and grounded by a second around line, which receives the internal signal to perform predetermined processing and is larger in charge/discharge current than said input circuit; and a capacitance having two terminals connected between said first power supply line and said first ground line, wherein said capacitance is either one of a junction capacitance having an n-type impurity region and a p-type impurity region formed in a surface portion of a semiconductor substrate, and an electrode formed on the impurity region via an insulating film.

8. A semiconductor device comprising:

an input circuit which is applied with a first power supply voltage via a first power supply line, grounded by a first ground line, and externally receives an input signal to output an internal signal;

an internal circuit which is applied with a second power supply voltage via a second power supply line, grounded by a second ground line, receives the internal signal to perform predetermined processing, and is larger in charge/discharge current than said input circuit;

a substrate bias generator for generating a substrate bias voltage, and applying the substrate bias voltage to a semiconductor substrate via a substrate bias voltage line connected to said semiconductor substrate on which at least either one of said input circuit and said internal circuit is formed;

a first capacitance having two terminals connected between said first power supply line and said first ground line;

a second capacitance having two terminals connected between said first power supply line and said second power supply line; and a third capacitance having two terminals connected between said first power supply line and said substrate bias voltage line.

9. A device according to claim 8, wherein capacitance values of said first, second, and third capacitances are set equal to each other.

10. A semiconductor device comprising:

an input circuit which is applied with a first power supply voltage via a first power supply line, grounded by a first ground line, and externally receives an input signal to output an internal signal;

an internal circuit which is applied with a second power supply voltage via a second power supply line, grounded by a second ground line, receives the internal signal to perform predetermined processing, and is larger in charge/discharge current than said input circuit;

a first substrate bias generator for generating a first substrate bias voltage, and applying the first substrate bias voltage to a first well of a first conductivity type via a first substrate bias voltage line connected to said first well on which at least either one of said input circuit and said internal circuit is formed;

a second substrate bias generator for generating a second substrate bias voltage, and applying the second substrate bias voltage to a second well of a second conductivity type via a second substrate bias voltage line connected to said second well on which at least either one of said input circuit and said internal circuit is formed;

a first capacitance having two terminals connected between said first power supply line and said first ground line;

a second capacitance having two terminals connected between said first power supply line and said second power supply line;

a third capacitance having two terminals connected between said first power supply line and said first substrate bias voltage line; and a fourth capacitance having two terminals connected between said first power supply line and said second substrate bias voltage line.

11. A device according to claim 10, wherein capacitance values of said first, second, third, and fourth capacitances are set equal to each other.

* * * * *